(12) United States Patent
Huang

(10) Patent No.: US 6,643,919 B1
(45) Date of Patent: Nov. 11, 2003

(54) METHOD OF FABRICATING A SEMICONDUCTOR DEVICE PACKAGE HAVING A CORE-HOLLOWED PORTION WITHOUT CAUSING RESIN FLASH ON LEAD FRAME

(75) Inventor: Chien-Ping Huang, Hsinchu Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/574,869

(22) Filed: May 19, 2000

(51) Int. Cl.$^7$ .................. H01R 43/00; H05K 3/34; B29C 39/28; H01L 21/48; H01L 21/50

(52) U.S. Cl. .................. 29/827; 29/840; 29/854; 29/856; 264/272.17; 264/276; 438/123; 438/124

(58) Field of Search .................. 29/827, 854, 855, 29/856, 840; 438/106–127; 264/272.15, 272.17, 276

(56) References Cited

U.S. PATENT DOCUMENTS

| | | | |
|---|---|---|---|
| 3,943,623 A | * 3/1976 | Mizutani et al. ............... | 29/854 |
| 4,069,465 A | * 1/1978 | Kouchich et al. ............. | 338/20 |
| 4,812,420 A | * 3/1989 | Matsuda et al. ............. | 257/680 |
| 5,070,041 A | 12/1991 | Katayama et al. | |
| 5,091,341 A | * 2/1992 | Asada et al. ............. | 257/675 |
| 5,093,281 A | * 3/1992 | Eshima ............. | 29/827 |
| 5,424,249 A | * 6/1995 | Ishibashi ............. | 257/787 |
| 5,444,025 A | * 8/1995 | Sono et al. ............. | 257/796 |
| 5,536,685 A | * 7/1996 | Burward-Hoy ............. | 29/832 |
| 5,686,361 A | * 11/1997 | Ootsuki ............. | 29/827 |
| 6,048,754 A | * 4/2000 | Katayama et al. ............. | 438/115 |

FOREIGN PATENT DOCUMENTS

| | | | | |
|---|---|---|---|---|
| JP | 56083048 A | * | 7/1981 | ............ H01L/23/02 |
| JP | 60132347 A | * | 7/1985 | ............ H01L/23/02 |
| JP | 63131552 A | * | 6/1988 | ............ H01L/23/08 |
| JP | 01151251 A | * | 6/1989 | ............ H01L/23/02 |
| JP | 02271556 A | * | 11/1990 | ............ H01L/23/02 |

* cited by examiner

Primary Examiner—Allan N. Shoap
Assistant Examiner—Isaac Hamilton
(74) Attorney, Agent, or Firm—Peter F. Corless; Steven M. Jensen; Edwards & Angell, LLP

(57) ABSTRACT

A semiconductor device package fabrication method is proposed, which is used for the fabrication of a semiconductor device package of the type having a core-hollowed portion that is typically used to house an optically-sensitive semiconductor device such as an image sensor or an ultraviolet-sensitive EPROM (Electrically-Programmable Read-Only Memory) device. The proposed method is characterized in the use of a support pillar, which is positioned beneath the lead frame when the lead frame is clamped between a top inserted mold and a bottom cavity mold, to help prevent resin flash on the lead frame during the molding of the core-hollowed portion. As a result, the proposed method can help strengthen the bonding of the semiconductor device on the die pad as well as the wire bonding on the inner end of the finger portion of the lead frame, Moreover, since the making of the support pillar would be significantly cheaper and easier to implement than the use of an organic high-molecule coating and a solvent as in the case of the prior art flash prevention, the proposed method is more cost-effective and environmentally-friendly to use than the prior art.

10 Claims, 3 Drawing Sheets

METHOD OF FABRICATING A SEMICONDUCTOR DEVICE PACKAGE HAVING A CORE-HOLLOWED PORTION WITHOUT CAUSING RESIN FLASH ON LEAD FRAME

BACKGROUND OF THE INVENTION

1. Field of the Invention

This invention relates to semiconductor device packaging teleology, and more, particularly, to a method of fabricating a semiconductor device package of the typo having a core-hollow portion that is typically used to house an optically-sensitive semiconductor device, such as an image sensor or a,n ultraviolet-sensitive EPROM (Electrically-Programmable Read-Only Memory) device, which can help prevent resin flash on a lead frame during the molding of the core-hollowed portion.

2. Description of Related Art

Semiconductor device packaging technology is used to pack one or more semiconductor chips in a single module that can be easily handled and mounted onto printed circuit boards. Typically, the semiconductor chip or chips are enclosed inside an opaque compound (or called an encapsulated body), and is thus invisible from the outside. However, for optically-sensitive types of semiconductor chips, such as image-sensor chips or ultraviolet-sensitive EP-ROM (Electrically-Programmable Read-Only Memory) chips, it is required to allow these chips to sense ambient light. For this reason, a special package configuration is used to pack these types of semiconductor chips. One conventional package configuration to pack an optically-sensitive semiconductor chip is to mount it in an encapsulated body having a core-hollowed portion; and then, after performing wire bonding to the chip, hermetically seal a transparent lid over the opening of the core-hollowed portion of the encapsulated body. Ambient light can then pass through the transparent lid to the inside of the encapsulated body to be sensed by the chip enclosed therein.

One drawback to the foregoing package configuration, however, is that, during the molding of the core-hollowed portion, resin flash on a lead frame is a serious problem, which would undesirably degrade the quality of the die attachment and wire bonding on the flashed parts of the lead frame. To solve this problem, various solutions have been proposed, including, for example, the U.S. Pat. No. 5,070,041 entitled "METHOD OF REMOVING FLASH FROM A SEMICONDUCTOR LEADFRAME USING COATED LEADFRAME AND SOLVENT" issued on Dec. 3, 1991, which can remove resin flash built up on the lead frame without damaging a resin molded section. This patented method is characterized in the steps of coating an organic high-molecule substance over the areas of the lead frame that are to be uncovered by the molded compound; and then, after the encapsulated body is completely formed, using a special solvent to wash away the organic high-molecule coating, whereby the resin flash can be removed together with the organic high-molecule coating. After this, a semiconductor chip is mounted onto the flash-free die pad, and then a transparent lid is hermetically sealed to the opening of the core-hollowed portion of the encapsulated body.

The foregoing patented method, however, has the following drawbacks. Firstly, the step of coating the organic high-molecule substance and the subsequent step of dissolving the coating to remove resin flash are quite complex in procedure and costly to implement, making the overall fabrication process quite cost-ineffective. Secondly, the solvent can be corrosive to the lead frame, which would also undesirably degrade the quality of the die attachment and wire bonding on the lead frame. Third, the solvent, after being used, would cause pollution and thus is environmentally-unfriendly to use.

SUMMARY OF THE INVENTION

It is therefore an objective of this invention to provide a new method for fabricating a semiconductor device package of the type having a core-hollowed portion, which can help prevent resin flash on lead frame during the molding of the core-hollowed portion.

It is another objective of this invention to provide a new method for fabricating a semiconductor device package of the type having a core-hollowed compound, which can help prevent resin flash on a lead frame without having to use an expensive coating process and environmentally-pollutant solvent.

It is still another objective of this invention to provide a new method for fabricating a semiconductor device package of the type having a core-hollowed compound, which can help prevent resin flash on lead frame in a more cost-effective and quality-assured way than the prior art.

It is still another objective of this invention to provide a new method for fabricating a semiconductor device package of the type having a core-hollowed compound, which allows the fabricated package to be more reliable to use than the prior art.

In accordance with the foregoing and other objectives, the invention proposes a new method for fabricating a semiconductor device package of the type having a core-hollowed compound. The method of the invention includes the following procedural steps: (1) preparing a lead frame having a die-pad portion and a finger portion; (2) preparing an electrically-insulative support pillar having a flat top surface, and which is dimensioned to a predetermined width and a predetermined height; (3) preparing a molding tool set including a top inserted mold and a bottom cavity mold; wherein the top inserted mold is formed with a sidewall cavity structure, while the bottom cavity mold is formed with a base cavity structure whose depth is substantially equal to the height of the support pillar; (4) containing the support pillar within the base cavity structure of the bottom cavity mold; and then, placing the lead frame over the support pillar, with the die-pad portion and the inner end of the finger portion of tho lead frame being placed directly over the top surface of the support pillar; (5) pressing the top inserted mold down against the lead frame, allowing the entire die-pad portion and the inner end of the finger portion of the lead frame to be substantially airtightly clamped between the support pillar and the top inserted mold; (6) performing a molding process to fill a molding material into the sidewall cavity structure of the top inserted mold and the remaining void space of the base cavity structure of the bottom cavity mold that is unoccupied by the support pillar, so as to form an encapsulated body having a top sidewall part defining a core-hollowed portion for die attachment and wire bonding and a bottom base part encapsulating the support pillar; (7) removing the top inserted mold and the bottom cavity mold; (8) performing a die-attachment process to attach at least one semiconductor chip onto the die-pad portion of the lead frame within the core-hollowed portion of the encapsulated body; (9) performing a wire-bonding process to connect a set of bonding wires for electrically coupling the semiconductor chip to the inner cad of the finger portion of the lead frame; and (10) performing a lidding process to hermetically seal a lid over the opening of the core-hollowed portion of the top sidewall part of the encapsulated body.

The foregoing method of the invention is characterized in the use of the support pillar, which is positioned beneath the lead frame when the lead frame is clamped between a top inserted mold and a bottom cavity mold during the molding process, to help prevent resin flash on the lead frame during the molding of the core-hollowed portion. As a result, the method of the invention can help strengthen the bonding of the semiconductor chip on the die pad as well as the bonding of wires on the inner end of the finger portion of the lead frame, making the overall package body more assured in quality and reliability.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, three preferred embodiments are disclosed in full details in the following with reference to FIGS. 1A–1D, FIG. 2, and FIG. 3, respectively.

FIRST PREFERRED EMBODIMENT (FIGS. 1A–1D)

The first preferred embodiment of the method of the invention is disclosed in full details in the following with reference to FIGS. 1A–1D.

Figure 1A:
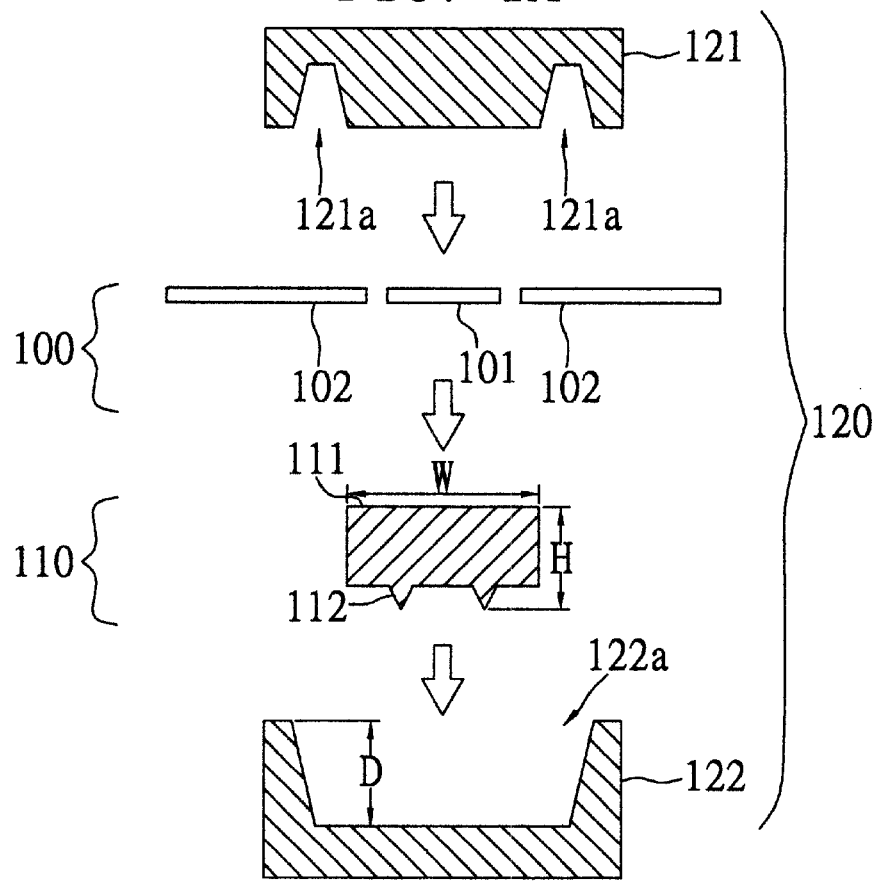
FIGS. 1A–1D are schematic sectional diagrams used to depict the procedural steps involved in a first preferred embodiment of the method of the invention for fabricating a. semiconductor device package for an optically-sensitive semiconductor chip.

Referring to FIG. 1A, by the method of the invention, the first step is to prepare a lead frame 100, a support pillar 110, and a molding tool set 120.

The lead frame 100 is the type having a die-pad portion 101 and a finger portion 102 (the finger portion 102 includes a plurality of fingers, or called leads, which are not all shown in the sectional view of FIG. 1A). In this embodiment, the support pillar 110 is an electrically-insulative block having a flat top surface 111 and a legged bottom surface 112, and is dimensioned to a predetermined width W that can substantially cover the range of the entire die-pad portion 101 and the inner end of the finger portion 102 and a predetermined height H substantially equal to the elevated height of the die-pad portion 101 of the lead frame 100.

The molding tool set 120 includes: a top inserted mold 121 and a bottom cavity mold 122. The top inserted mold 121 is formed with a sidewall cavity structure 121a (so named because it will be later used for the forming of a sidewall part of the mold compound), while the bottom cavity mold 122 is formed with a base cavity structure 122a (so named because it will be later used for the forming of a base part of the mold compound). The base cavity structure 122a should have a depth D substantially equal to the height H of the support pillar 110.

Figure 1B:
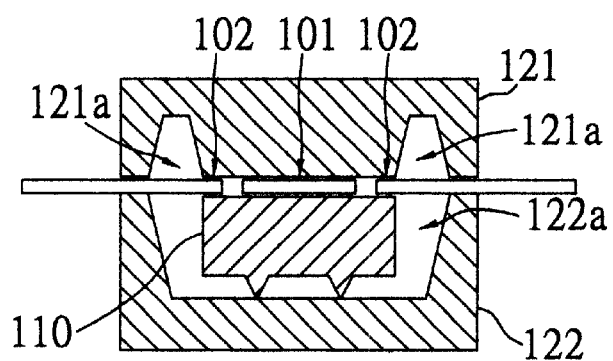

Referring further to FIG. 1B, in the next step, the above-mentioned lead frame 100, support pillar 110, and molding tool set 120 are put together in such a manner that the support pillar 110 is held within the base cavity structure 122a of the bottom cavity mold 122; then, the bottom side of the entire die-pad portion 101 and the inner end of the finger portion 102 of the lead frame 100 is placed on the top side of the support pillar 110; and then, the top inserted mold 121 is forcefully pressed down against the top side of the lead frame 100, allowing the entire die-pad portion 101 and the inner end of the finger portion 102 of the lead frame 100 to be substantially airtightly clamped between the flat top surface 111 of the support pillar 110 and the bottom surface of the top inserted mold 121.

Under the foregoing arrangement, a molding process is performed to fill a molding material, such as resin, into the sidewall cavity structure 121a of the top inserted mold 121 and the remaining void portion of the base cavity structure 122a of the bottom cavity mold 122 that is unoccupied by the support pillar 110. It is a characteristic feature of the invention that, during this molding process, the entire die-pad portion 101 and the inner end of the finger portion 102 of the lead frame 100 can be substantially prevented from resin flash since these portions are substantially airtightly clamped between the flat top surface 111 of the support pillar 110 and the bottom surface of the top inserted mold 121.

Figure 1C:
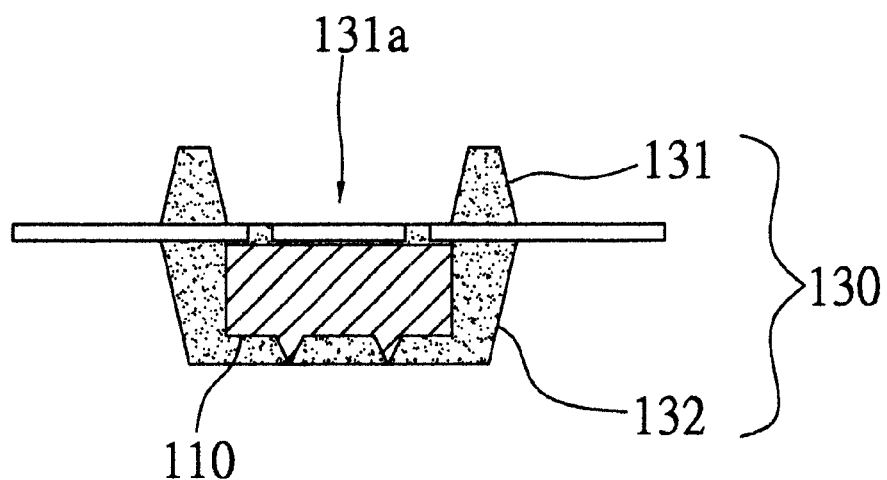

Referring further to FIG. 1C, in the next step, both the top inserted mold 121 and the bottom cavity mold 122 are removed. Through the foregoing molding process, a resin encapsulated body 130 is formed, which includes a sidewall part 131 on the top side of the lead frame 100 and a base part 132 on the bottom side of the same. The top sidewall part 131 defines a core-hollowed portion 131a for subsequent die attachment and wire bonding, while the base part 132 is used to encapsulate the entire support pillar 110 and serves as a base support means to the entire package body.

Figure 1D:
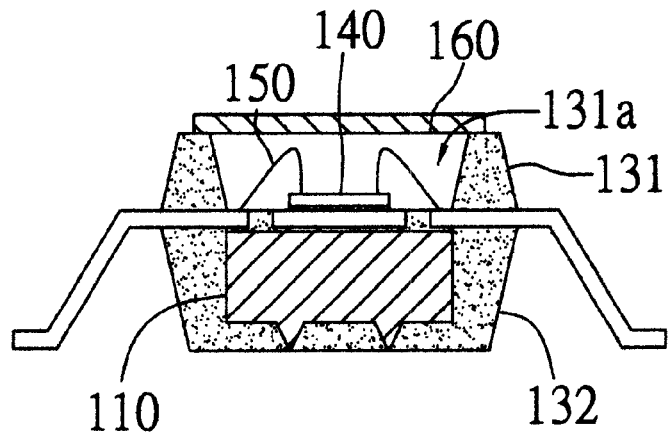

Referring further to FIG. 1D, in the next step, a die-attachment process is performed to attach a semiconductor chip 140, typically an optically-sensitive semiconductor chip such as an image sensor chip or an EPROM chip, onto the top side of the die-pad portion 101 of the lead frame 100 within the core-hollowed portion 131a of the top sidewall part 131 of the encapsulated body 130.

Subsequently, a wire-bonding process is performed to connect a set of bonding wires 150, such as gold wires, for electrically coupling the semiconductor chip 140 to the inner end of the finger portion 102 of the lead frame 100.

During the foregoing two processes, since the top side of the entire die-pad portion 101 and the inner end of the linger portion 102 of the lead frame 100 arc flash-free owing to the featured step of the invention depicted in FIG. 1B, the die attachment and the wire bonding can be reliably achieved.

Finally, a lidding process is performed to hermetically seal a transparent lid 160, such as a glass lid, over the top opening of the core-hollowed portion 131a of the top sidewall part 131 of the encapsulated body 130. This completes the fabrication of the intended semiconductor device package.

Figure 2:
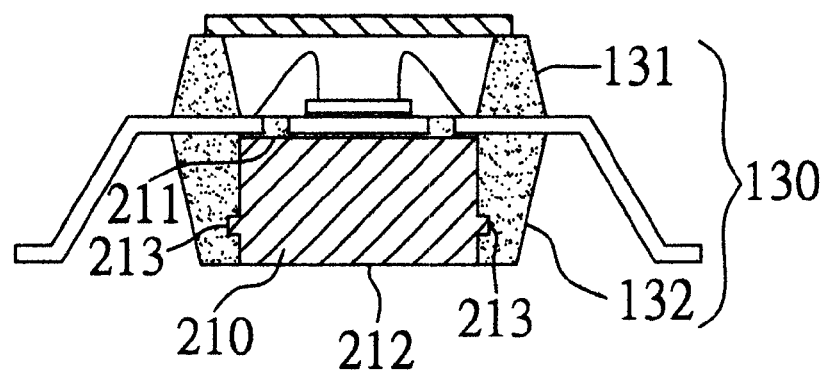
FIG. 2 is a schematic sectional diagram used to depict a second preferred embodiment of the method of the invention.

Second Preferred Embodiment (FIG. 2)

The second preferred embodiment of the method of the invention is disclosed in the following with reference to FIG. 2. In FIG. 2, the parts that are identical in structure and purpose as those in the previous embodiment are labeled with the same reference numerals.

As shown in FIG. 2, this embodiment differs from the previous one only in that the support pillar is used here, which is designated by the reference numeral 210, is shaped in a different fashion. The support pillar 210 is an electrically-insulative block having a flat top surface 211 and a flat bottom surface 212, and is additionally formed with a plurality of sidewall protruded portions 213 on the sidewall thereof.

During the molding process for the encapsulated body 130, this support pillar 210 is positioned exactly in the same manner as the support pillar 110 of the previous embodiment shown in FIG. 1B, so that it can help prevent resin flash on the lead frame 100. After the molding process, the entire bottom surface 212 of the support pillar 210 is exposed to the outside of the encapsulated body 130, with the sidewall protruded portions 213 serving as bolting means that can help prevent the entire support pillar 210 from sliding out of the base part 132 of the encapsulated body 130.

Figure 3:
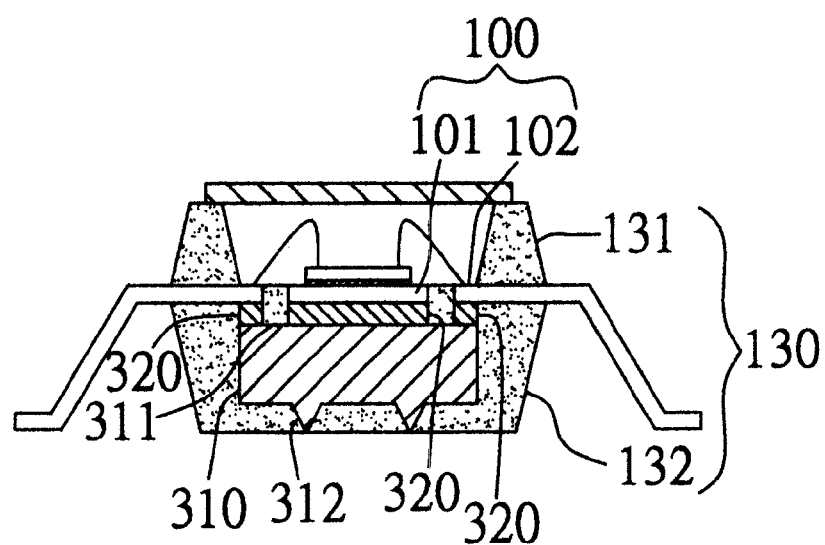
FIG. 3 is a schematic sectional diagram used to depict a third preferred embodiment of the method of the invention.

Third Preferred Embodiment (FIG. 3)

The third preferred embodiment of the method of the invention is disclosed in the following with reference to FIG. 3. In FIG. 3, the parts that are identical in structure and purpose as those in the previous embodiments are labeled with the same reference numerals.

As shown in FIG. 3, this embodiment employs a support pillar 310 which is identically in structure as the support pillar 110 used in the first embodiment, but differs in that the support pillar 310 used here has its flat top surface 311 bonded by means of adhesive paste 320 to the bottom side of the entire die-pad portion 101 and the inner end of the finger portion 102 of the lead frame 100 before performing the molding process. This can firmly bond the support pillar 310 to the lead frame 100;.

During the molding process for the encapsulated body 130, this support pillar 310 is positioned exactly in the same manner as the support pillar 110 of the first embodiment shown in FIG 1B. Since the support pillar 310 here is bonded firmly to the lead frame 100, it allows the support pillar 310 to be absolutely fixed in position when the lead frame 100 is forcefully clamped between the top inserted mold 121 and the bottom cavity mold 122, thus providing a more secured airtight clamping of the entire die-pad portion 101 and the inner end of the finger portion 102 of the lead frame 100 between the support pillar 310 ad the top inserted mold 121.

Conclusion

In conclusion, it can be learned from the foregoing description that the method of the invention can help prevent resin flash on the entire die-pad portion and the inner end of the finger portion of the lead frame by clamping these lead frame portions airtightly between the support pillar and the top inserted mold. Since the making of the support pillar would be significantly much cheaper and easier to implement than the use of an organic high-molecule coating and a solvent for flash prevention, the invention is undoubtedly more cost-effective to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a semiconductor device package, comprising the steps or
   (1) preparing a lead frame having a die-pad portion and a finger portion;
   (2) preparing an electrically-insulative support pillar leaving a flat top surface, and which is dimensioned to a predetermined width and a predetermined height;
   (3) preparing a molding tool set including a top inserted mold and a bottom cavity mold wherein the top inserted mold is formed with a sidewall cavity structure, while the bottom cavity mold is formed with a base cavity structure whose depth is substantially equal to the height of the support pillar;
   (4) dropping the support pillar into the base cavity structure of the bottom cavity mold; and then, placing the lead frame over the support pillar, with the die-pad portion and an inner end of the finger portion of the lead frame being placed directly over the top surface of the support pillar;
   (5) pressing the top inserted mold down against the lead frame, allowing the entire die-pad portion and the inner end of the finger portion of the lead frame to be substantially airtightly clamped between the support pillar and the top inserted mold;
   (6) performing a molding process to fill a molding material into the sidewall cavity structure of the top inserted mold and remaining void space of the base cavity structure of the bottom cavity mold that is unoccupied by the support pillar, so as to form an encapsulated body having a top sidewall part defining a core-hollowed portion for die attachment aid wire bonding and a bottom base part encapsulating the support pillar;
   (7) removing the top inserted mold and the bottom cavity mold;
   (8) performing a die-attachment process to attach at least one semiconductor chip onto tie die-pad portion of the lead frame within the core-hollowed portion of the encapsulated body;
   (9) performing a wire-bonding process to connect a set of bonding wires for electrically coupling the semiconductor chip to the inner end of the finger portion of the lead frame; and
   (10) performing a lidding process to hermetically seal a lid over an opening of the core-hollowed portion of the top sidewall part of the encapsulated body.

2. The method of claim 1, wherein the support pillar has a legged bottom surface.

3. The method of claim 1, wherein the support pillar has a flat bottom surface and a sidewall protruded portion.

4. The method of claim 3, wherein the support pillar is encapsulated with its bottom surface entirely exposed to outside of the encapsulated body.

5. The method of claim 1, wherein the support pillar has its flat top surface bonded by means of adhesive paste to a bottom side of the entire die-pad portion and the inner end of the finger portion of the lead frame.

6. The method of claim 1, wherein the semiconductor chip is an image sensor.

7. The method of claim 1, wherein the semiconductor chip is an EPROM device.

8. The method of claim 1, wherein the molding material is resin.

9. The method of claim 1, wherein the bonding wires are gold wires.

10. The method of claim 1, wherein the lid is a glass lid.

* * * * *